United States Patent
Aipperspach et al.

(10) Patent No.: US 6,172,531 B1
(45) Date of Patent: Jan. 9, 2001

(54) LOW POWER WORDLINE DECODER CIRCUIT WITH MINIMIZED HOLD TIME

(75) Inventors: Anthony Gus Aipperspach; Peter Thomas Freiburger, both of Rochester, MI (US)

(73) Assignee: International Business Machines Corporation, Armonk, NY (US)

( * ) Notice: Under 35 U.S.C. 154(b), the term of this patent shall be extended for 0 days.

(21) Appl. No.: 09/251,089

(22) Filed: Feb. 16, 1999

(51) Int. Cl.[7] .................. H03K 19/0948; H03K 19/096
(52) U.S. Cl. .............................. 326/108; 326/98; 326/121
(58) Field of Search .................... 326/93, 95–98, 326/105–106, 108; 365/230.06

(56) References Cited

U.S. PATENT DOCUMENTS

| | | | |
|---|---|---|---|
| 4,692,637 | * 9/1987 | Shoji | 326/97 |
| 5,291,076 | 3/1994 | Bridges et al. | |
| 5,737,270 | 4/1998 | Oppold et al. | |
| 5,757,205 | * 5/1998 | Ciraula et al. | 326/96 |
| 5,825,208 | * 10/1998 | Levy et al. | 326/98 |
| 5,841,304 | * 11/1998 | Tam | 327/161 |
| 5,917,355 | * 6/1999 | Klass | 326/98 |

* cited by examiner

*Primary Examiner*—Jon Santamauro
(74) *Attorney, Agent, or Firm*—Joan Pennington

(57) ABSTRACT

A wordline decoder circuit and method of decoding a wordline input signal are provided. A first decoder receives multiple inputs to be evaluated. The first decoder includes a first precharge device for precharging a first node and a first discharge device to enable discharging the first node. A first clock signal enables the first discharge device. The first clock signal disables the precharge device. A clock delay circuit receives the first clock signal and generates a delayed clock signal. A second logic is coupled to the first decoder. The second logic provides a wordline output. The second logic wordline output is enabled responsive to the delayed clock signal and is disabled responsive to the first clock signal.

19 Claims, 11 Drawing Sheets

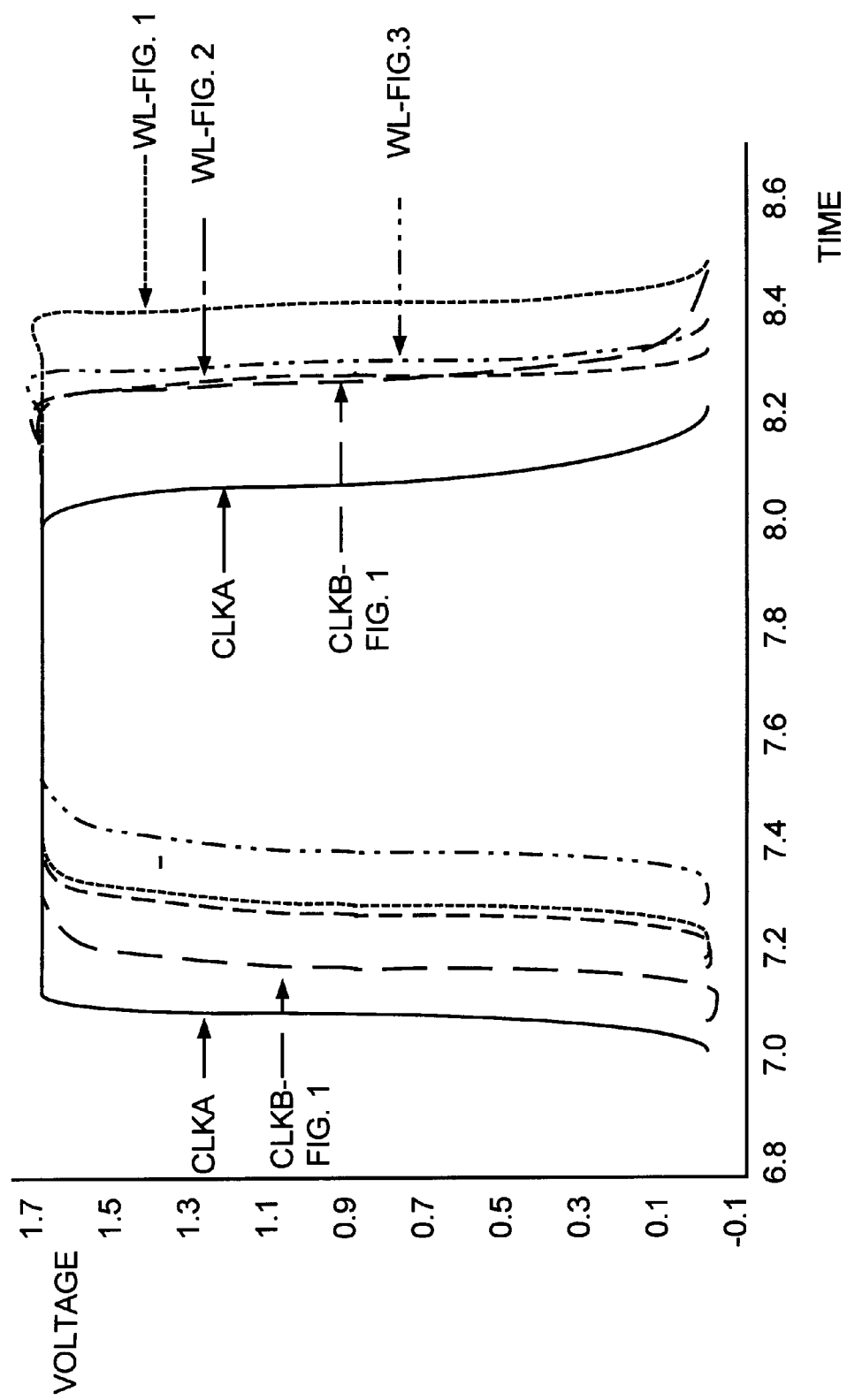

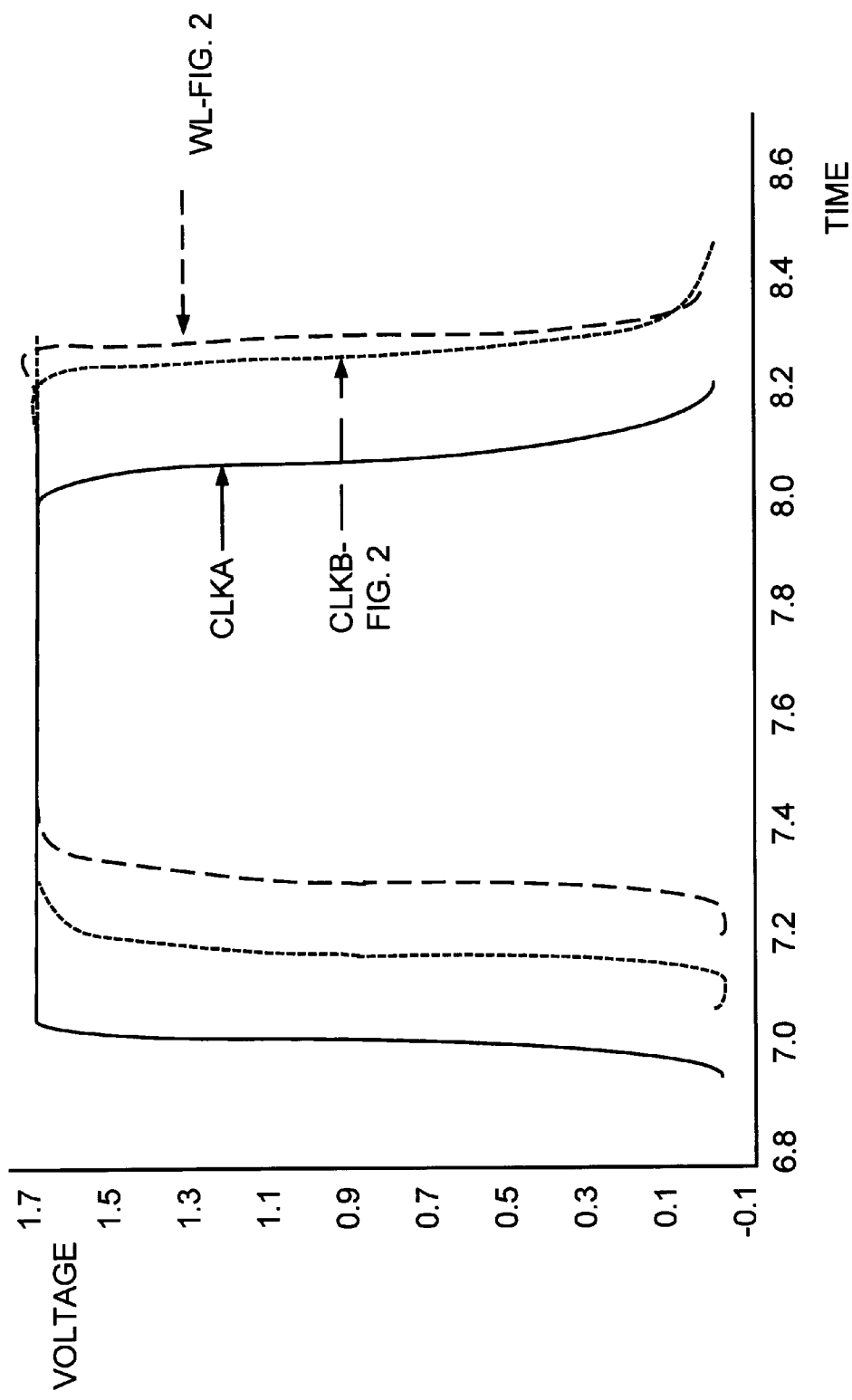

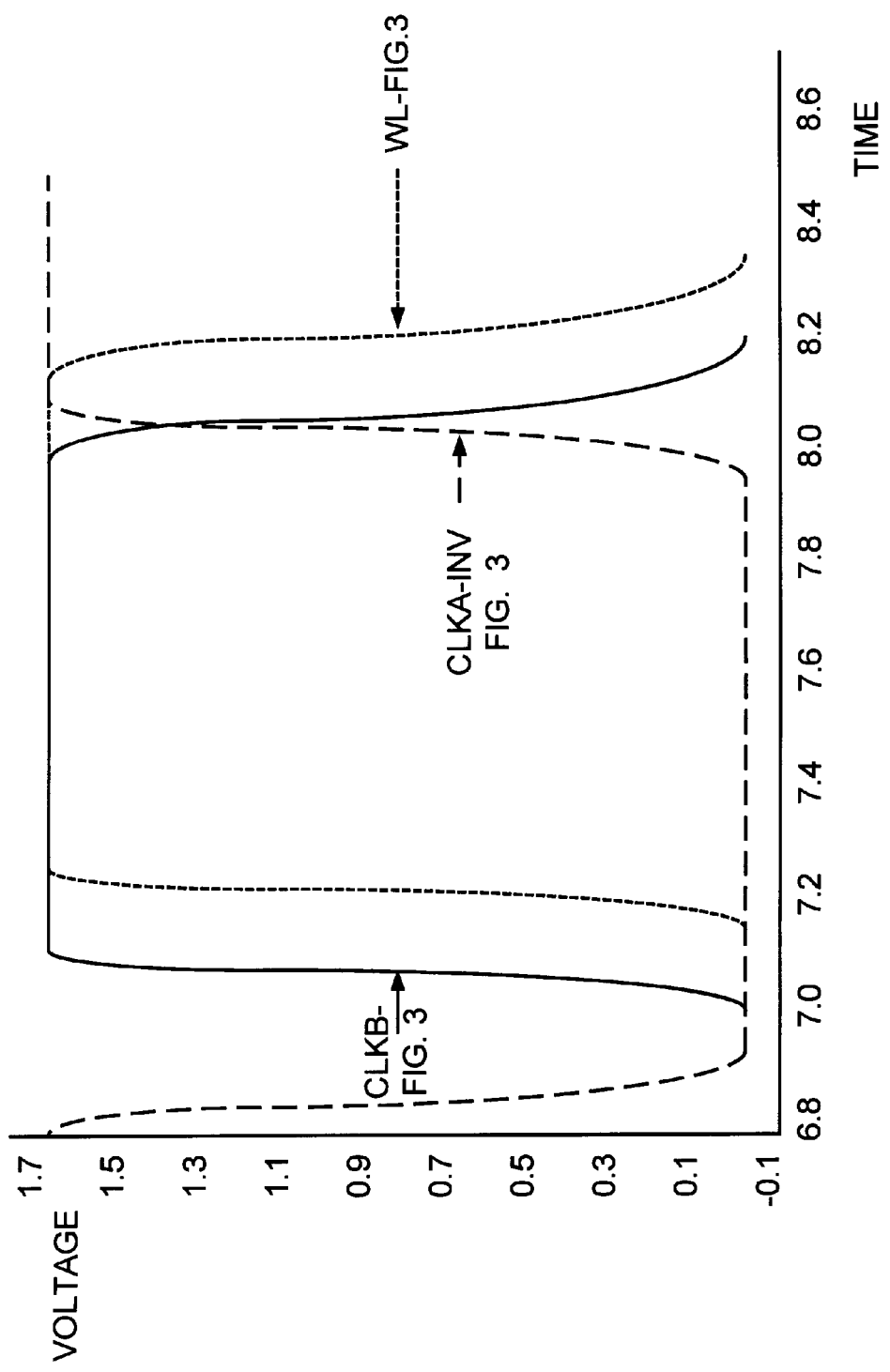

LOW POWER WORDLINE DECODER CIRCUIT WITH MINIMIZED HOLD TIME

FIELD OF THE INVENTION

The present invention relates to clocked decoder circuits, and more particularly to, an improved wordline decoder circuit.

DESCRIPTION OF THE RELATED ART

Clocked NOR decoders are common in the art. For example, U.S. Pat. No. 5,737,270 discloses NOR decoders with locally generated clocks. FIG. 1 shows a precharged wordline decoder disclosed by U.S. Pat. No. 5,737,270. Precharged wordline decoder includes a first NOR decoder formed of multiple N-channel field effect transistors NFETs N0, N1, and NN connected between word OR top node (WORT) and word OR bottom node (WORB), respectively receiving address bits A0–AN. Precharged wordline decoder includes precharge P-channel field effect transistors PFETs P1 and P2, respectively precharging WORT and WORB nodes, and a discharge N-channel field effect transistor NFETs ND1. In the NOR decoder, a first local clock CLKA is applied to discharge NFET ND1 and to a clock delay circuit formed by inverters INV1, INV2. The clock delay circuit generates a locally-controlled delayed clock signal CLXB. A driver logic NAND circuit is formed by a driver NFET NDR, a precharge PFET P3, a discharge NFET ND2, clamping PFETs P4 and P5, and an inverter INV3.

In FIG. 1, driver logic NAND circuit receives the locally-controlled delayed clock signal CLKB that is applied to the gates of precharge PFET P3 and discharge NFET ND2. The gates of precharge PFETs P1 and P2 are connected to the gates of precharge PFET P3 and discharge NFET ND2 receiving delayed clock signal CLKB. The delayed clock signal CLKB disables the precharge PFETS P1 and P2 of the first NOR decoder. The gate of NFET NDR is driven by the output of NFETs N0, N1, through NN. The drain of driver NFET NDR at node labeled WLB is connected to the input of inverter INV3 which provides the wordline output indicated at line WORDLINE. The clamping PFETs P4 and P5 respectively hold a high voltage level at nodes WLB and WORDLINE, preventing the decoder circuit from misdecoding due to a drop in the voltage level at the output nodes of the clamping devices. The driver logic NAND circuit receives the delayed clock signal CLKB for controlling the wordline driver devices, NFET NDR and inverter INV 3.

Many existing decoder circuits have significant power requirements. Often required long hold times of existing decoder circuits are accommodated by delaying the data, thus adding area and impacting other aspects of performance.

Many existing decoder circuits have gating signals other than address bits, such as thread-select or enable to determine when the decoded signal is to be activated. In the common implementation of the clocked NOR decoder, an additional NOR device can be added. However an additional input will increase the NOR node loading and reduce performance slightly. In the case of a thread-select signal, the penalty is much greater. The thread-select function indicates the address decoding for the A-thread, is unique from the B-thread. Normally, the decodes would have to be duplicated using two copies of the illustrated decoder of FIG. 1. One copy is active when the A-thread is selected, and the other being active when the B-thread is selected. The loading penalty on the address inputs is doubled by the addition of the thread-select function. In many designs, this additional loading is not tolerable due to the additional setup time it puts on the address inputs.

While the NOR decoder circuits of U.S. Pat. No. 5,737,270 provides improved performance over many existing decoder circuits, a need exists for an improved clocked NOR decoder circuit having improved power dissipation. It is desirable to provide improved hold time of NOR decoders with local clocks. It is desirable to provide an improved precharged wordline decoder with improved input loading characteristics.

SUMMARY OF THE INVENTION

A principal object of the present invention is to provide an improved wordline decoder circuit. Other objects are to provide such improved wordline decoder circuit enabling improved power dissipation; to provide such improved wordline decoder circuit enabling improved hold time performance and to provide such improved wordline decoder circuit substantially without negative effects and that overcomes many of the disadvantages of prior art arrangements.

In brief, a wordline decoder circuit and method of decoding a wordline input signal are provided. A first decoder receives multiple inputs to be evaluated. The first decoder includes a first precharge device for precharging a first node and a first discharge device to enable discharging the first node. A first clock signal enables the first discharge device. The first clock signal disables the precharge device. A clock delay circuit receives the first clock signal and generates a delayed clock signal. A second logic is coupled to the first decoder. The second logic provides a wordline output. The second logic wordline output is enabled responsive to the delayed clock signal and is disabled responsive to the first clock signal.

BRIEF DESCRIPTION OF THE DRAWINGS

The present invention together with the above and other objects and advantages may best be understood from the following detailed description of the preferred embodiments of the invention illustrated in the drawings, wherein:

FIGS. 4A, 4B, 4C, and 4D are charts with voltage relative to a vertical axis and time relative to a horizontal axis illustrating operation of the precharged wordline decoders of the preferred embodiment of FIGS. 2 and 3 for comparison with the prior art precharged wordline decoder of FIG. 1;

DETAILED DESCRIPTION OF THE PREFERRED EMBODIMENTS

Figure 2:
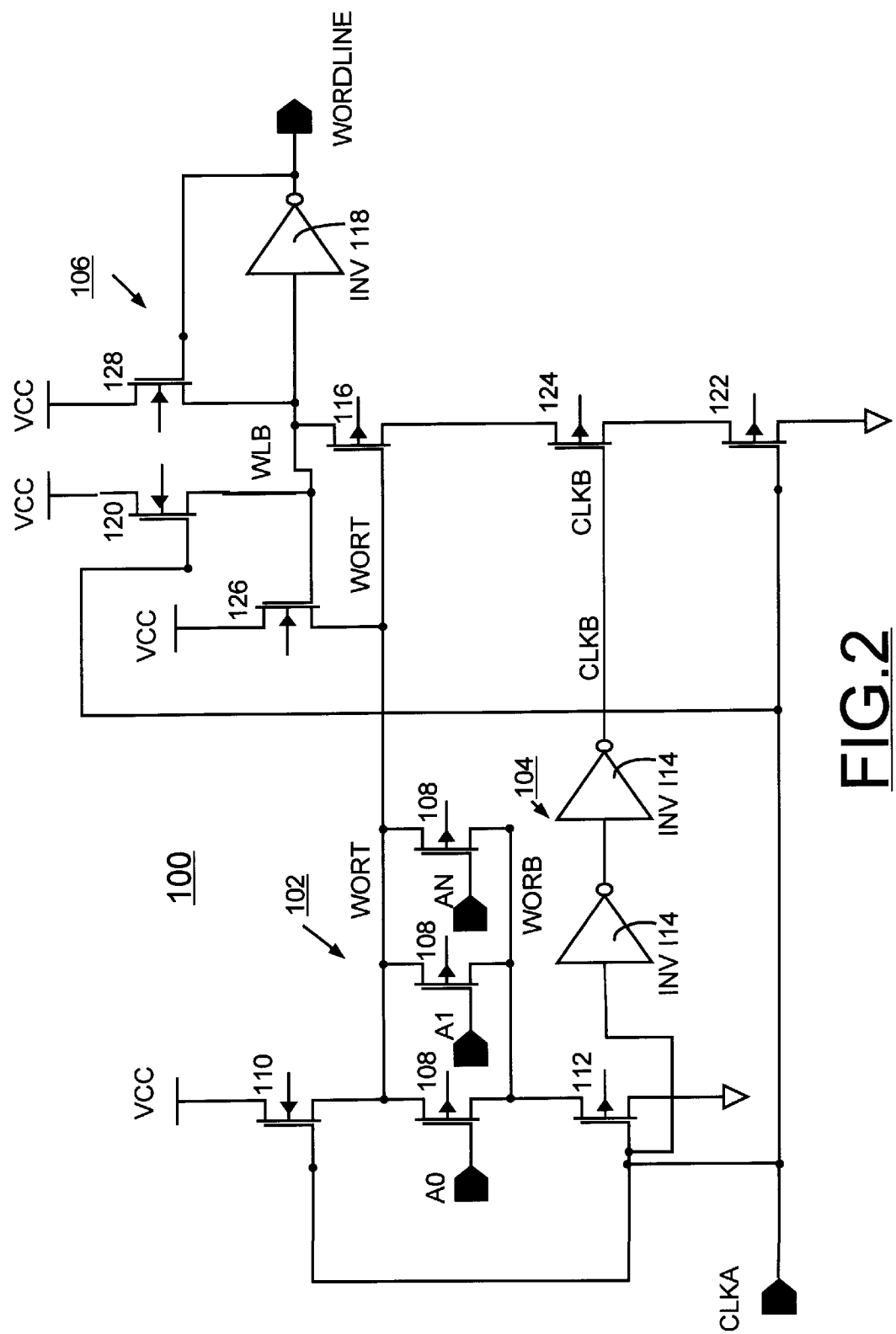
FIG. 2 is a schematic diagram of a precharged wordline decoder with a local clock in accordance with a preferred embodiment of the present invention.

Having reference now to the drawings, FIG. 2 illustrates a precharged wordline decoder circuit generally designated by the reference character 100 in accordance with a preferred embodiment of the present invention. Precharged wordline decoder circuit 100 is an embodiment of the invention using the same phase clock.

Figure 1:
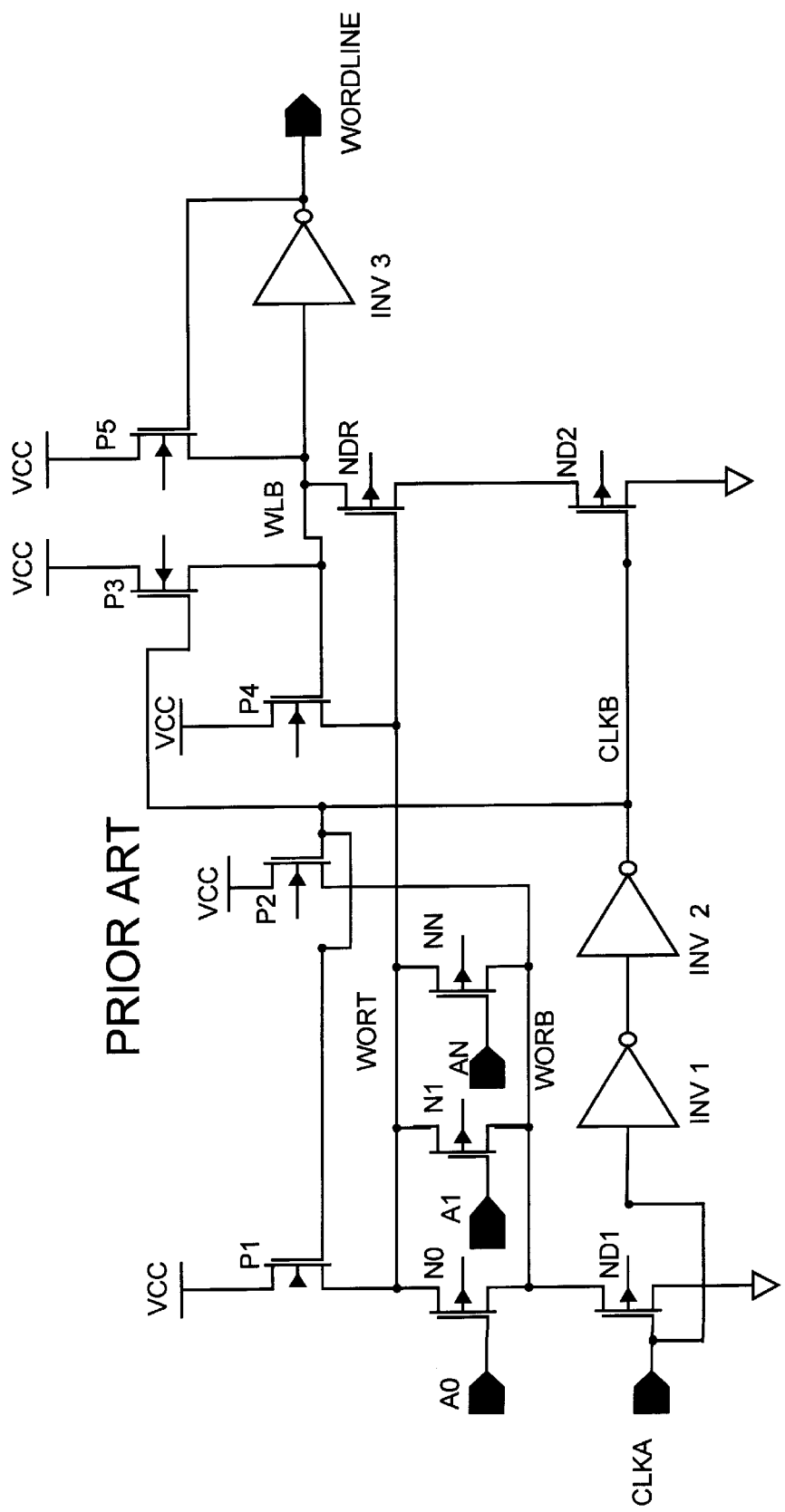
FIG. 1 is a schematic diagram of a prior art precharged wordline decoder with local clocks.

In accordance with features of the present invention, precharged wordline decoder circuit 100 provides improved hold time and less power dissipation as compared to the prior art circuit of FIG. 1. With no penalty to the activation delay for the output WORDLINE, the precharged wordline decoder circuit 100 reduces power and shortens the hold time. Precharged wordline decoder 100 includes a first NOR decoder 102, a clock delay circuit 104 and a second NAND wordline driver 106. NOR decoder 102 includes multiple N-channel field effect transistors NFETs 108 connected between a word OR top (WORT) node and a word OR bottom (WORB) node respectively receiving address bits A0–AN. NOR decoder 102 includes a single precharged P-channel field effect transistor PFETs 110 connected to WORT node and an evaluate, discharge N-channel field effect transistor NFET 112 connected to the sources of the NFETs 108.

Clock delay circuit 104 is formed by a pair of series connected inverters 114 receiving a clock CLKA. Clock delay circuit 104 generates a locally-controlled delayed clock signal CLKB at the output of the series connected inverters 114. Driver logic NAND circuit 106 is formed by a driver NFET 116, a driver inverter 118, a precharged PFET 120, a discharge NFET 122, and a NFET 124. Driver logic NAND circuit 106 includes a pair of clamping PFETs 126 and 128.

In precharged wordline decoder 100, the clock signal CLKA is applied to gates of precharge PFET 110 and discharge NFET 112 of NOR decoder 102. The clock signal CLKA also is applied to the gates of precharge PFET 120 and discharge NFET 122 of the driver logic NAND circuit 106. Driver logic NAND circuit receives the locally-controlled delayed clock signal CLKB applied to the gate input of NFET 124. The gate of driver NFET 116 is driven by the output of the evaluate NFETs 108. The drain of driver NFET 116 at node labeled WLB is connected to the input of inverter 118 which provides the wordline output indicated at line WORDLINE. The clamping PFETs 126 and 128 respectively hold a high voltage level at nodes WORT and WLB, preventing the decoder circuit from misdecoding due to a drop in the voltage level at the output nodes of the clamping devices.

Power reduction is accomplished by eliminating the precharge of WORB by precharge PFET P2 of FIG. 1, and by changing the gate on precharge PFET 110 from CLKB of FIG. 1 to CLKA so that when CLKA goes high, PFET 110 is turned off. As a result, there is no DC current flow through PFET 110 and NFET 112 as the rising edge propagates from CLKA to CLKB. An improved hold time is accomplished by shortening the delay from CLKA falling to WORDLINE falling. A delay is required between CLKA rising and CLKB rising to give setup time for node WORT to evaluate or to unselect N-1 out of N wordlines. However, that same delay is not required and is in fact a nuisance from CLKA falling to WORDLINE falling. This delay is minimized in precharged wordline decoder 100 by routing CLKA around the delay circuit 104 and directly into precharge PFET 120 and NFET 122 of the NAND decoder 106.

Figure 3:
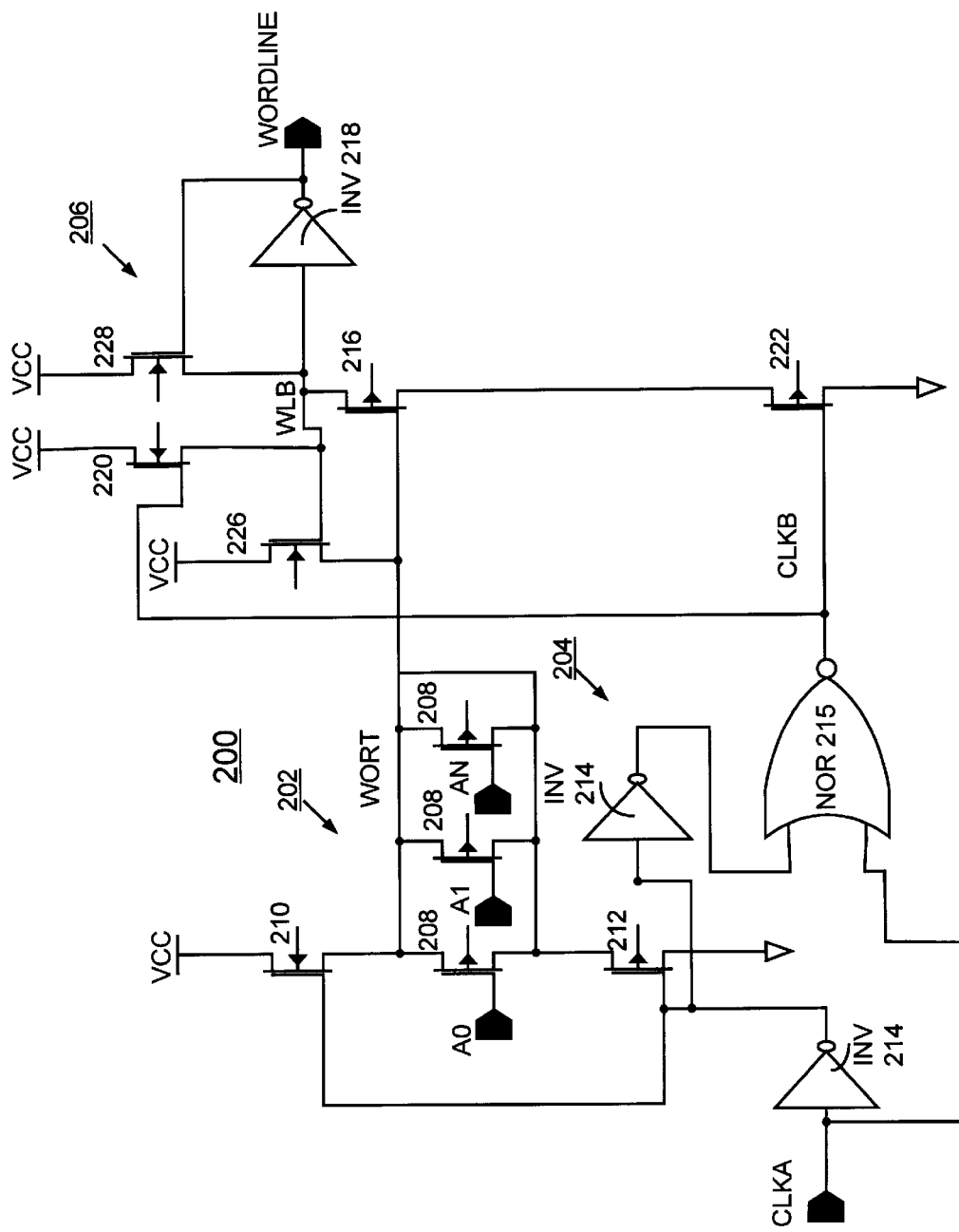
FIG. 3 is a schematic diagram of an alternative precharged wordline decoder with an inverted clock input in accordance with a preferred embodiment the present invention.

Referring now to FIG. 3, there is shown an alternative precharged wordline decoder generally designated by the reference character 200 in accordance with a preferred embodiment the present invention. Precharged wordline decoder 200 includes an opposite phase of input clock CLKA of FIG. 2. Precharged wordline decoder 200 similarly includes a first NOR decoder 202, a clock delay circuit 204 and a second NAND wordline driver 206. NOR decoder 202 includes multiple N-channel field effect transistors NFETs 208 connected between a word OR top (WORT) node and a word OR bottom (WORB) node respectively receiving address bits A0–AN. NOR decoder 202 includes a single precharged P-channel field effect transistor PFET 210 connected to WORT node and a discharge N-channel field effect transistor NFET 212.

Clock delay circuit 204 is formed by a pair of series connected inverters 214 connected to a first input of a NOR gate 215. A clock CLKA is applied to the input of the series connected inverters 214. The clock CLKA is applied to a second input of the NOR gate 215 which provides the CLKB output. Driver logic NAND circuit 206 is formed by a driver NFET 216, a driver inverter 218, a precharged PFET 220, and a discharge NFET 222. Driver logic NAND circuit 206 similarly includes a pair of clamping PFETs 226 and 228. In clock delay circuit 204, a clock chopper on CLKB is implemented to reduce the falling edge delay. The CLKB output of NOR 215 provides the reduced falling edge delay responsive to the CLKA input. An inverted CLKA output of the first of the series connected inverters 214 is applied to the precharge PFET 210 and discharge NFET 212. CLKB is applied to the gates of precharged PFET 220 and discharge NFET 222 of NAND driver circuit 206.

Figure 4B:
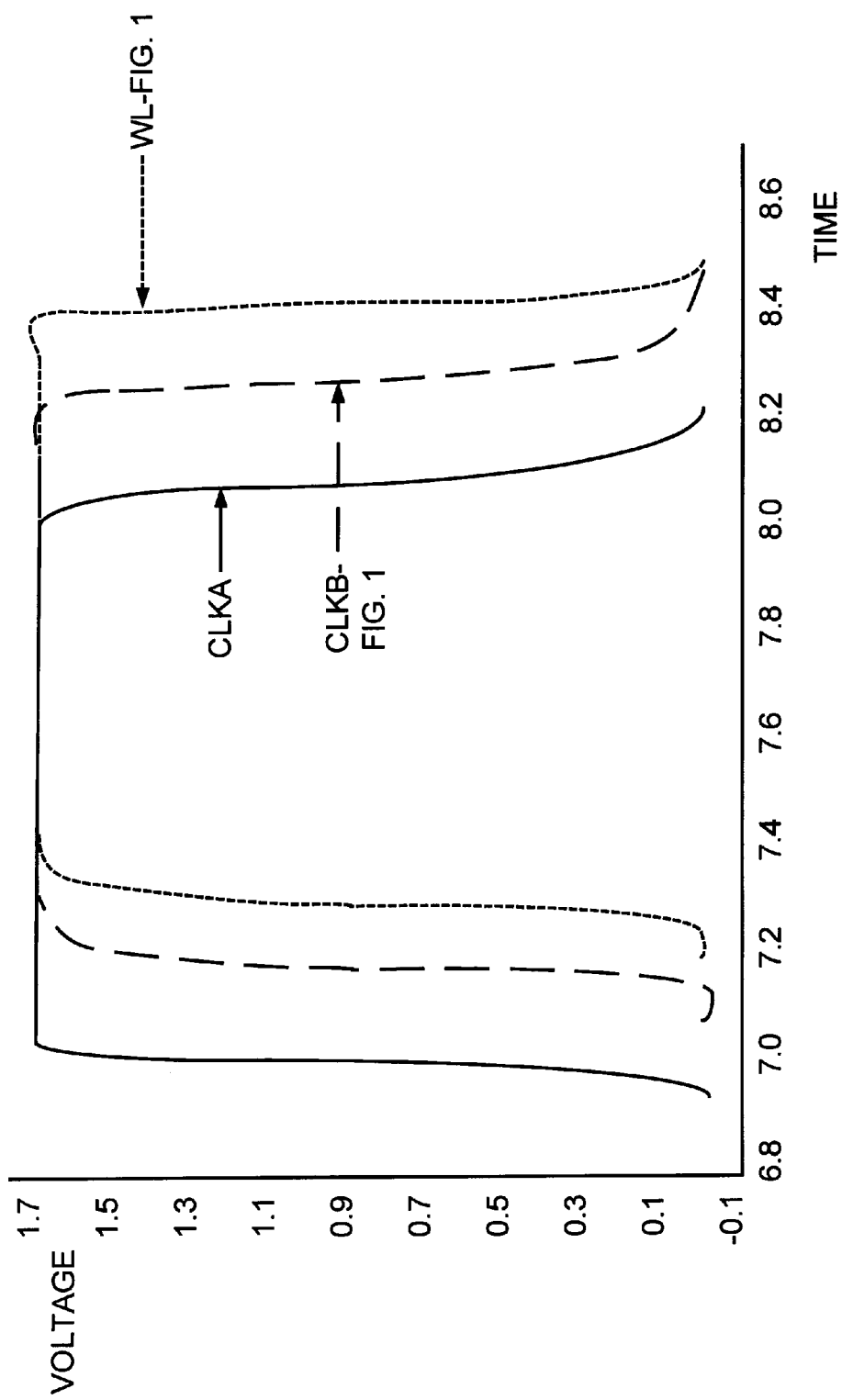
Figure 5:
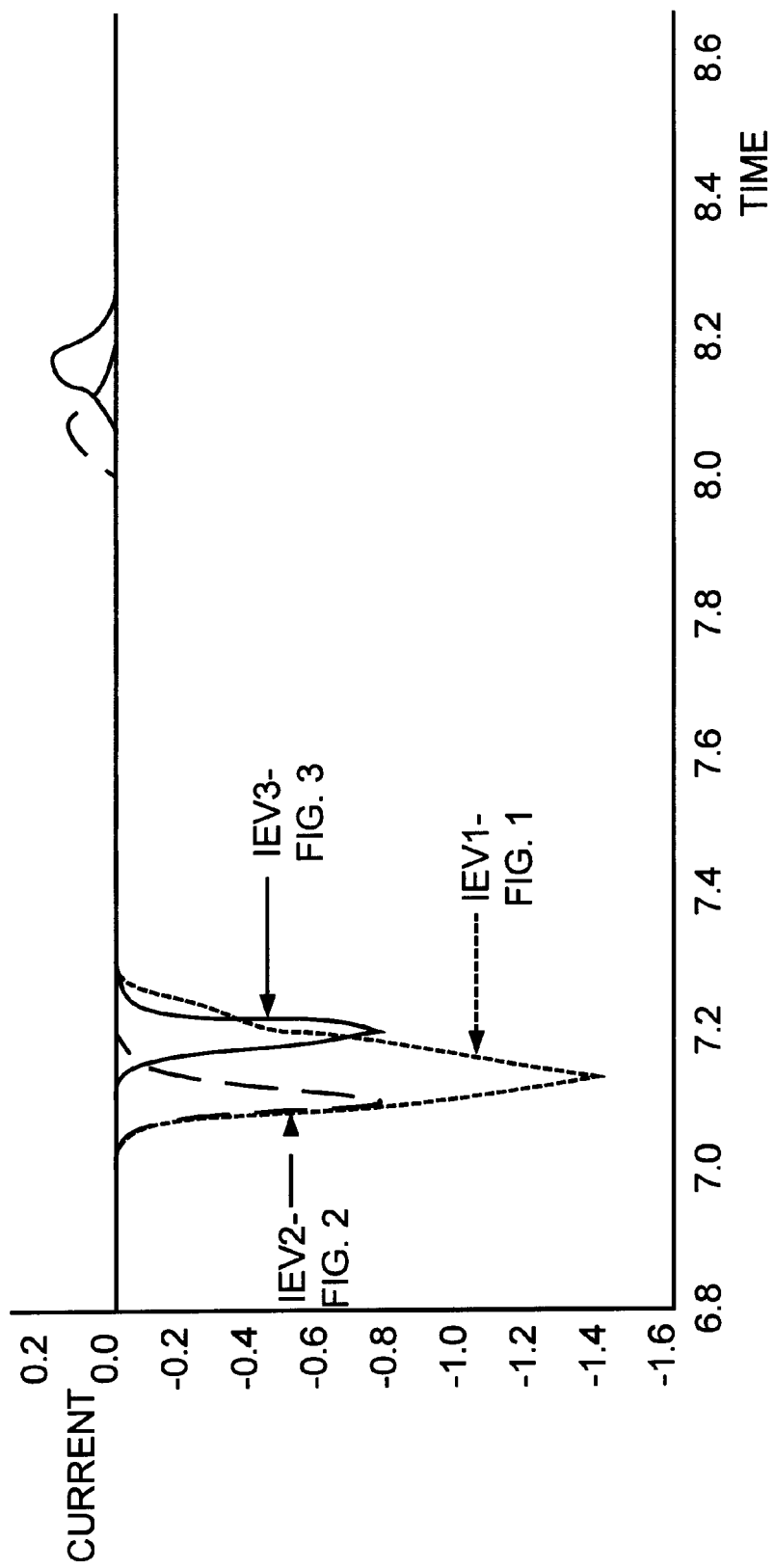
FIG. 5 is a chart with current relative to a vertical axis and time relative to a horizontal axis illustrating operation of the precharged wordline decoders of the preferred embodiment of FIGS. 2 and 3 for comparison with the prior art precharged wordline decoder of FIG. 1.

FIGS. 4A, 4B, 4C, 4C and 5 illustrate operation of the precharged wordline decoders 100 and 200 in comparison with the prior art precharged wordline decoder of FIG. 1. FIG. 4A illustrates CLKA, CLKB generated by the prior art decoder of FIG. 1 together with wordline (WL) outputs of the prior art decoder of FIG. 1, and decoders 100 and 200 of the preferred embodiment. In FIG. 4A, the reduced hold times from the trailing edge of CLKA for the precharged wordline decoders 100 and 200 may be seen in comparison with the prior art precharged wordline decoder of FIG. 1. FIG. 4B illustrates the operation of the prior art decoder of FIG. 1. FIG. 4C illustrates the operation of the decoder 100 of FIG. 2. FIG. 4D illustrates the operation of the decoder 200 of FIG. 3 with inverted CLKA. FIG. 5 illustrates respective power requirements for the operation of prior art decoder of FIG. 1, and decoders 100 and 200 of the preferred embodiment. In FIG. 5, operation of prior art decoder of FIG. 1 is indicated at a line IEV1. Operation of decoders 100 and 200 of the preferred embodiment are respectively shown at lines IEV2 and IEV3. In FIG. 5, the reduced power requirements for the decoders 100 and 200 of the preferred embodiment may be appreciated as compared to the prior art decoder of FIG. 1.

Figure 6A:
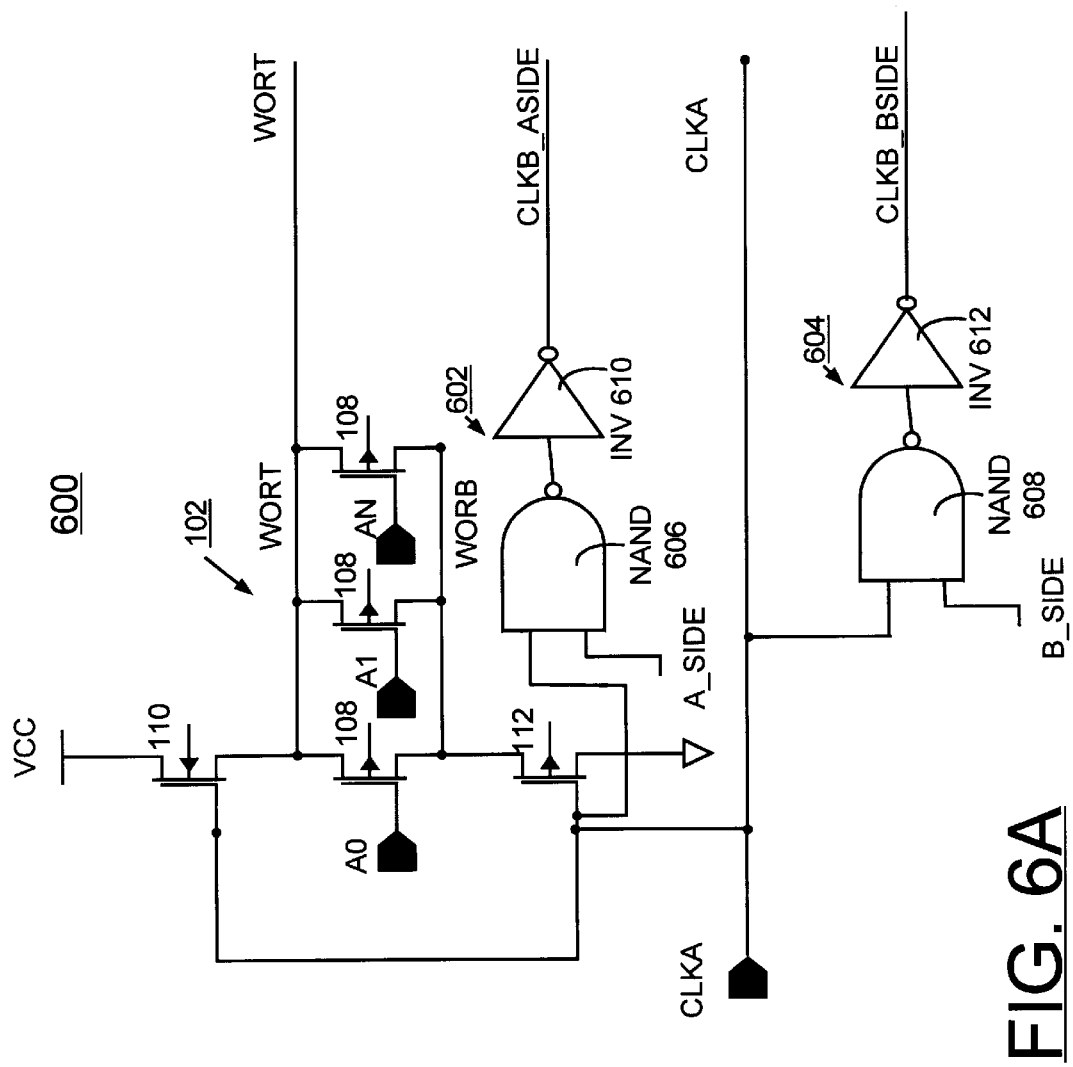
FIGS. 6A and 6B together provide a schematic diagram of an alternative precharged wordline decoder in accordance with preferred embodiments the present invention.
Figure 6B:
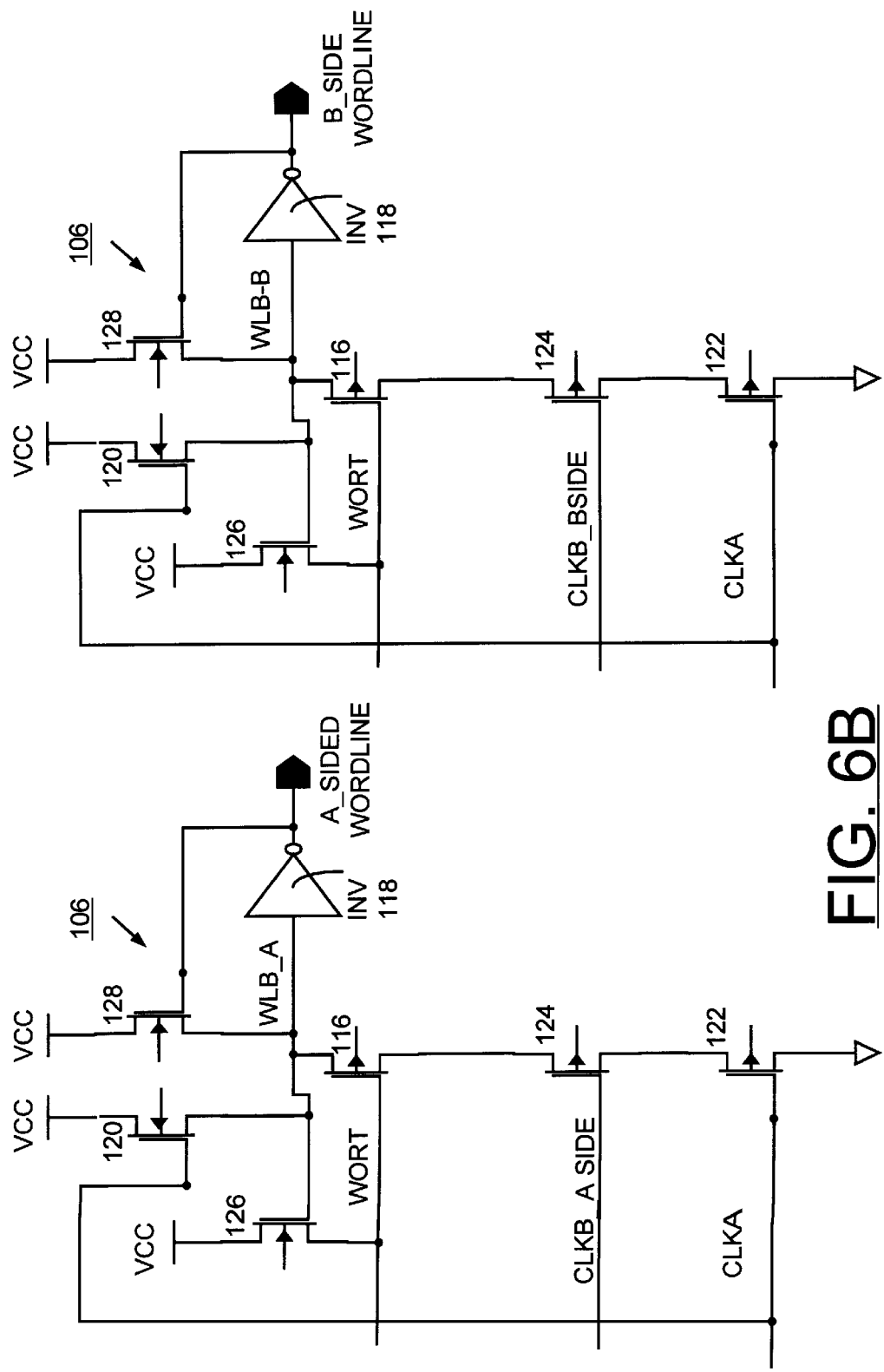
Figure 7:
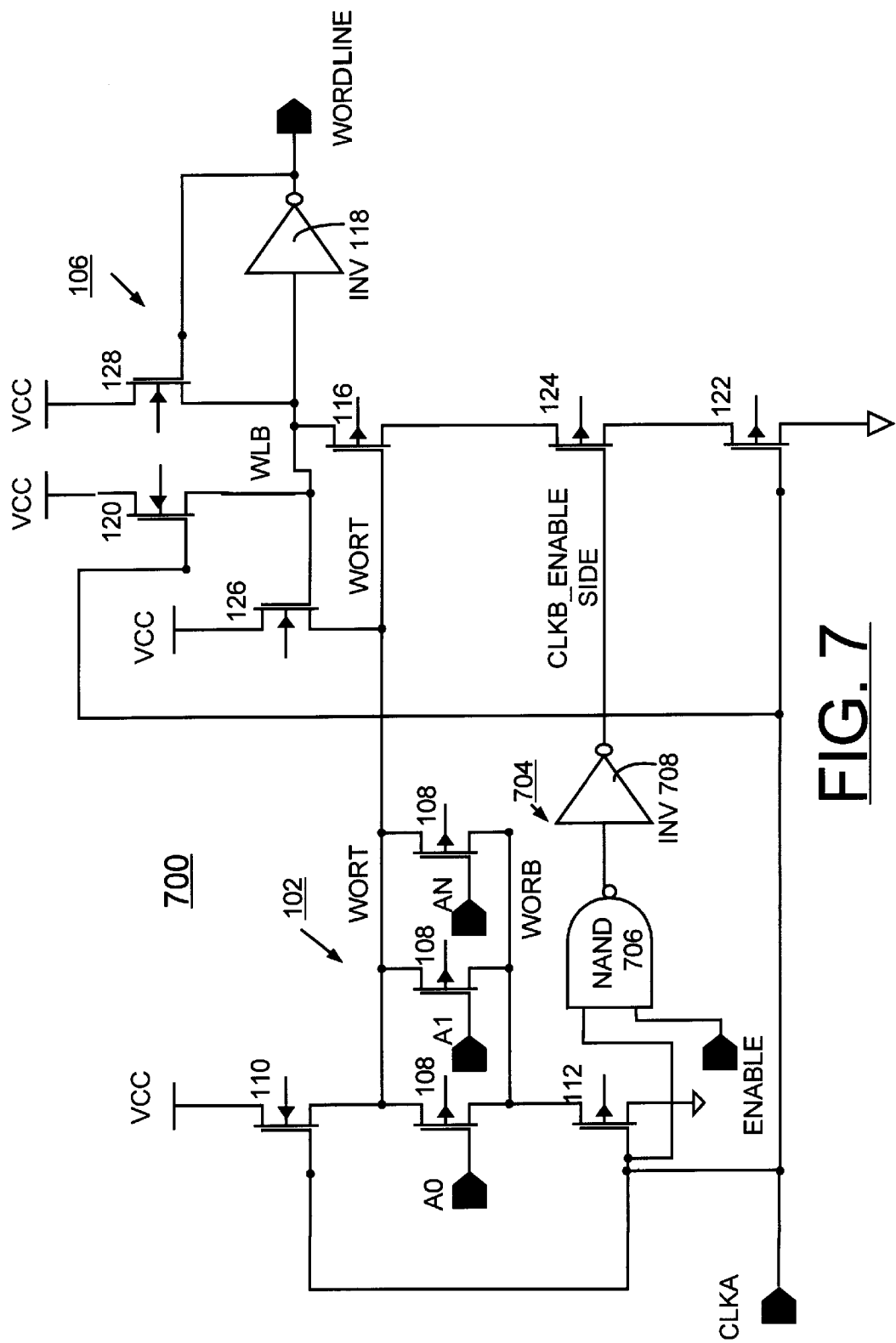
FIG. 7 is a schematic diagram of another alternative precharged wordline decoder in accordance with preferred embodiments the present invention.

FIGS. 6A and 6B and FIG. 7 respectively illustrate alternative precharged wordline decoders generally designated by reference character 600 and 700 in accordance with preferred embodiments the present invention with improved input loading characteristics.

Referring to FIGS. 6A and 6B, precharged wordline decoder 600 includes a single NOR decoder circuit 102 arranged to be shared between two NAND wordline drivers 206, for an A_SIDE and a B_SIDE thread select function. Precharged wordline decoder 600 utilizes a pair of clock delay circuits 602 and 604. Each clock delay circuit 602, 604 is formed by a respective NAND gate 606, 608 connected in series with a respective inverter 610, 612. CLKA is applied to a first input of NAND gates 606 and 608. An A_SIDE input is applied to a second input of NAND gate 606. An B_SIDE input is applied to a second input of NAND gate 608. To select either or both decoders 106 for the A_SIDE and/or B_SIDE address inputs to the NOR decoder 102, one or both of the A_SIDE and B_SIDE inputs to NAND gates 606 and 608 are selected. Since the address inputs A0–AN now support two outputs in the precharged wordline decoder 600, the loading to the buffers that create these inputs are now ½ of the prior art arrangement. This allows for improvement of the address setup time characteristics for the precharged wordline decoder 600. Further, since the delay performance of clock delay circuits 602 and 604 is set by how fast the WORT node discharges, sizing of the NAND gates 606, 608 and the address NOR devices 108 can be such that the CLIK to WORDLINE performance is not affected, while substantially retaining the setup time benefits.

Referring to FIG. 7, precharged wordline decoder 700 provides another form of the invention. Precharged wordline decoder 700 is formed of the NOR decoder circuit 102 and the NAND driver 106 of FIG. 3. Precharged wordline decoder 700 includes a clock delay circuit 704 including a NAND gate 706 connected in series with an inverter 708. In precharged wordline decoder 700, an enable signal is introduced into NAND gate 706, rather then being added to the NOR circuit 102 where the address inputs connect. Depending upon a particular application, precharged wordline decoder 700 can be a superior implementation.

While the present invention has been described with reference to the details of the embodiments of the invention shown in the drawing, these details are not intended to limit the scope of the invention as claimed in the appended claims.

What is claimed is:

1. The wordline decoder circuit comprising:
    a first clock signal;
    a first decoder receiving multiple inputs to be evaluated, said first decoder including a first precharge device for precharging a first node and a first evaluate discharge device to enable discharging said first node; said first clock signal enabling said first evaluate discharge device and said first clock signal disabling said precharge device;
    a clock delay circuit receiving said first clock signal and generating a delayed clock signal;
    a second logic coupled to said first decoder, said second logic providing a wordline output; said second logic wordline output being enabled responsive to said delayed clock signal and being disabled responsive to said first clock signal; and wherein said second driver logic includes a second precharge device for precharging a second node; said first clock signal disabling said second precharge device.

2. The wordline decoder circuit of claim 1, wherein said second driver logic includes a second discharge evaluate device and a third discharge evaluate device for discharging said second node; said first clock signal enabling said second discharge evaluate device and said delayed clock signal enabling said third discharge evaluate device.

3. The wordline decoder circuit of claim 1, wherein said second driver logic includes a gated driver device and said delayed clock signal enabling said gated driver device.

4. The wordline decoder circuit of claim 1, wherein said first decoder includes a plurality of evaluate transistors connected between said first node and said first, evaluate discharge device; and a control input of each said evaluate transistor receiving a respective one of said multiple inputs to be evaluated.

5. The wordline decoder circuit of claim 4, wherein said plurality of evaluate transistors define a NOR decoder.

6. The wordline decoder circuit of claim 1, wherein said second driver logic includes a plurality of transistors defining a NAND decoder.

7. The wordline decoder circuit comprising:
    a first clock signal;
    a first decoder receiving multiple inputs to be evaluated, said first decoder including a first precharge device for precharging a first node and a first evaluate discharge device to enable discharging said first node; said first clock signal enabling said first evaluate discharge device and said first clock signal disabling said precharge device;
    a clock delay circuit receiving said first clock signal and generating a delayed clock signal;
    a second logic coupled to said first decoder, said second logic providing a wordline output; said second logic wordline output being enabled responsive to said delayed clock signal and being disabled responsive to said first clock signal; and wherein said second driver logic includes at least one clamping device, coupled between a supply voltage and a second precharged node; said second driver logic includes said second precharged node.

8. The wordline decoder circuit of claim 7, wherein said first precharge device includes a P-channel field effect transistor (PFET) connected between a supply voltage and said first node, and said first clock signal applied to a gate input of said first precharge PFET.

9. The wordline decoder circuit of claim 7, wherein said clock delay circuit includes a pair of series connected inverters.

10. The wordline decoder circuit comprising:
    a first clock signal;
    a first decoder receiving multiple inputs to be evaluated, said first decoder including a first precharge device for precharging a first node and a first evaluate discharge device to enable discharging said first node; said first clock signal enabling said first evaluate discharge device and said first clock signal disabling said precharqe device;
    a clock delay circuit receiving said first clock signal and generating a delayed clock signal; said clock delay circuit including a pair of series connected inverters; said clock delay circuit further including a NOR gate connected to an output of said pair of series connected inverters and having a second input receiving said first clock signal;
    a second logic coupled to said first decoder, said second logic providing a wordline output; said second logic wordline output being enabled responsive to said delayed clock signal and being disabled responsive to said first clock signal.

11. The wordline decoder circuit comprising:
    a first clock signal;
    a first decoder receiving multiple inputs to be evaluated, said first decoder including a first precharge device for precharging a first node and a first evaluate discharge device to enable discharging said first node; said first clock signal enabling said first evaluate discharge device and said first clock signal disabling said precharge device;
    a clock delay circuit receiving said first clock signal and generating a delayed clock signal; said clock delay circuit including a pair of clock delay chains, each said clock delay chain including a NAND gate and an inverter connected in series and a second logic coupled to said first decoder, said second logic providing a wordline output; said second logic wordline output being enabled responsive to said delayed clock signal and being disabled responsive to said first clock signal.

12. The wordline decoder circuit of claim 11, wherein said NAND gate includes a first input receiving said first clock signal and a second input receiving a thread select signal.

13. The wordline decoder circuit of claim 11, wherein said NAND gate includes a first input receiving said first clock signal and a second input receiving an enable signal.

14. A method of decoding wordline inputs using a decoder circuit including a precharged NOR decoder for evaluating multiple address inputs, said precharged NOR decoder including a first precharge device for precharging a first node and a first evaluate discharge device to enable discharging said first node; and a precharged NAND driver logic coupled to said precharged NOR decoder for providing a wordline output; said method comprising the steps of:

disabling said first precharge device with said first clock signal;

enabling said first evaluate discharge device with said first clock signal;

receiving said first clock signal and generating a delayed clock signal; and using said delayed clock signal for enabling said precharged NAND driver logic to provide said wordline output; and using said first clock signal for disabling said precharged NAND driver logic.

15. The method of decoding a wordline inputs of claim 14, providing a NAND gate connected in series with a clock delay inverter for generating said delayed clock signal.

16. The method of decoding a wordline inputs of claim 15, includes applying said first clock signal to a first input of said NAND gate and applying a thread select signal to a second input of said NAND gate.

17. The method of decoding a wordline inputs of claim 15 includes applying said first clock signal to a first input of said NAND gate and applying an enable signal to a second input of said NAND gate.

18. A wordline decoder circuit comprising:

a first clock signal;

a first NOR decoder receiving multiple inputs to be evaluated, said first NOR decoder including a first precharge device for precharging a first node and a first evaluate discharge device to enable discharging said first node; said first clock signal enabling said first evaluate discharge device and said first clock signal disabling said precharge device;

a clock delay circuit receiving said first clock signal and generating a delayed clock signal; and a second driver logic coupled to said first decoder for providing a wordline output; said second driver logic including a second precharge device for precharging a second node; said delayed clock signal coupled to said second driver logic for enabling said wordline output; and said first clock signal coupled to said second driver logic for enabling said second precharge device.

19. The wordline decoder circuit of claim 18, wherein said first clock signal is coupled to said second driver logic for disabling said wordline output.

* * * * *